United States Patent

Kiyota

[11] Patent Number: 5,770,025
[45] Date of Patent: Jun. 23, 1998

[54] MAGNETRON SPUTTERING APPARATUS

[75] Inventor: Tetsuji Kiyota, Chigasaki, Japan

[73] Assignee: Nihon Shinku Gijutsu Kabushiki Kaisha, Kanagawa-ken, Japan

[21] Appl. No.: 690,789

[22] Filed: Aug. 1, 1996

[30] Foreign Application Priority Data

Aug. 3, 1995 [JP] Japan .................................. 7-198268
Aug. 3, 1995 [JP] Japan .................................. 7-198273

[51] Int. Cl.$^6$ ............................................. C23C 14/34
[52] U.S. Cl. .................................. 204/298.2; 204/298.19
[58] Field of Search ........................... 204/298.19, 298.2

[56] References Cited

U.S. PATENT DOCUMENTS 4,872,964  10/1989  Suzuki et al. .......................... 204/298.2
4,995,958   2/1991  Anderson et al. ...................... 204/298.2
5,417,833   5/1995  Harra et al. .......................... 204/298.2

*Primary Examiner*—Nam Nguyen
*Attorney, Agent, or Firm*—Larson & Taylor

[57] ABSTRACT

A magnetron sputtering apparatus with an improved magnetic field distribution on the surface of a target, so that a film is formed satisfactorily in each and every recess in a substrate arranged in the apparatus, wherein the magnet is so arranged as to produce a magnetic field distribution on the surface of the target having a horizontal magnetic field intensity equal to 0 only at points located within the outer periphery of the target and to ignite electric discharge at a pressure level as low as $10^{-2}$ Pa. The magnet is also so configured as to produce a magnetic field distribution having a horizontal magnetic field intensity of not lower than 140 Gauss at a position on the surface of the target where the vertical magnetic field intensity is equal to 0 and a vertical magnetic field intensity of not lower than 60 Gauss at a position on the surface of the target where the horizontal magnetic field intensity is equal to 0.

3 Claims, 10 Drawing Sheets

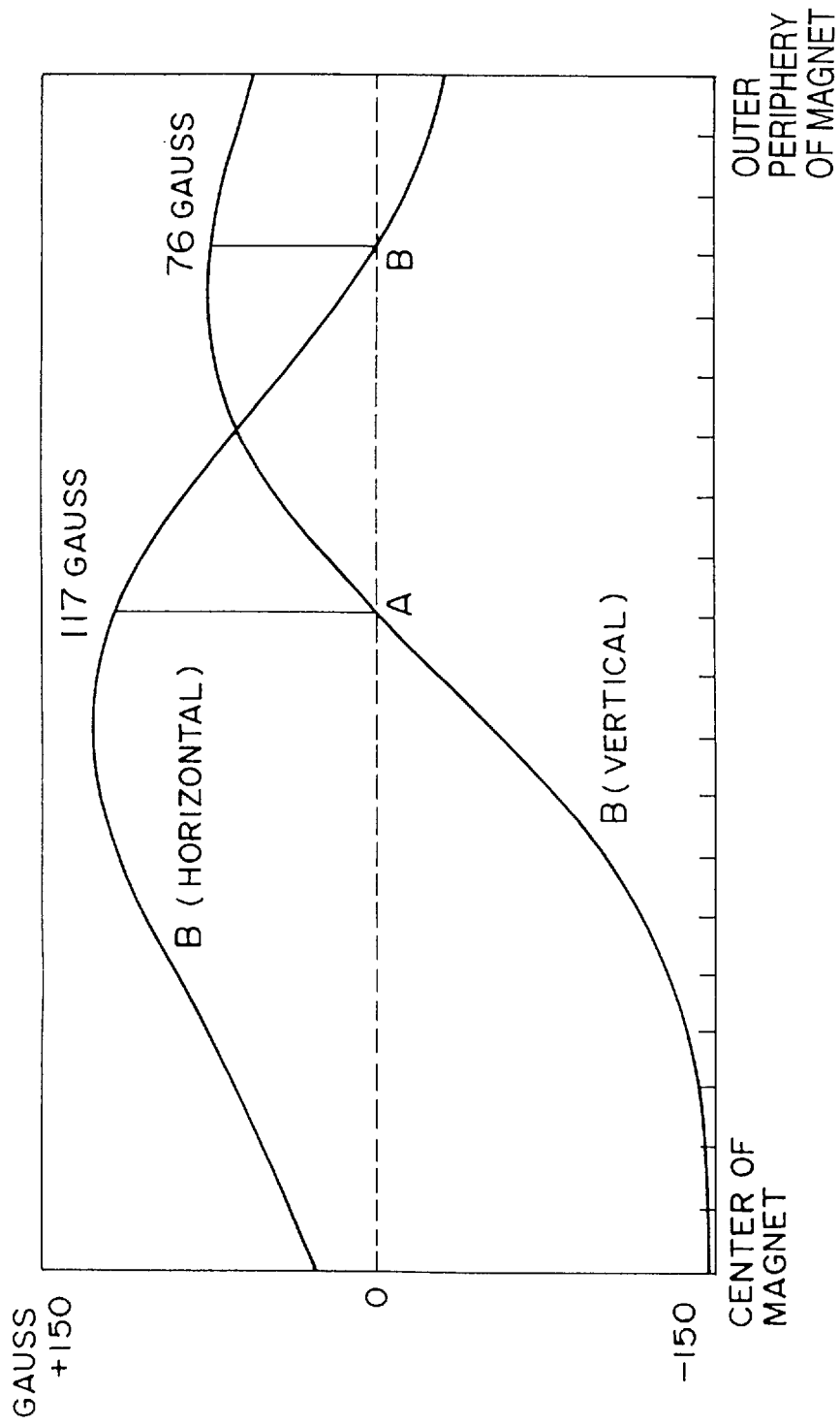

MAGNETRON SPUTTERING APPARATUS

BACKGROUND OF THE INVENTION

The present invention relates to a magnetron sputtering apparatus primarily applicable to formation of a thin film on a substrate in a process of manufacturing a semiconductor and other electronic devices.

The technique of magnetron sputtering is popularly use for forming a thin film on a substrate in the process of manufacturing semiconductor and other electronic devices because of the facility and controllability of handling.

In a conventional sputtering apparatus a target of a material for producing a film and a deposition substrate are arranged opposite to each other in a vacuum vessel or chamber, a discharge gas such as argon gas is introduced into the vacuum vessel while maintaining the interior of the vessel at a high vacuum, an electric discharge is generated by applying a negative voltage to the target, and ionized gas molecules (ions) produced in such electric discharge are accelerated by means of the negative voltage to strike the target and thus eject (i.e. sputter) atoms out of the surface of the target in diverse directions according to the cosine rule so that some of the sputtered atoms are deposited on the substrate to form a thin film.

With the magnetron sputtering, the electric discharge is conducted efficiently by arranging a magnet on the rear side of the target which produces a magnetic field on the front surface of the target.

FIG. 1 of the accompanying drawings schematically illustrates a conventional magnetron supporting apparatus. It comprises a vacuum chamber A in which a target T of material for producing a film is mounted on a target electrode B and a substrate S is arranged opposite to the target T and mounted on a substrate holder C. A magnet D is arranged on the rear side of the target electrode B to generate lines of magnetic force typically as indicated by arrows E. The vacuum chamber A is provided was a gas inlet port F for introducing discharge gas thereinto and a gas outlet port G for evacuating part the gas in the inside in order to maintain the internal pressure at a constant vacuum level. Reference symbol H denotes a DC source for applying a negative voltage to the target electrode B to generate an electric discharge.

For ordinary sputtering operation, the distance separating the target and the substrate (T/S distance) is between 30 and 60 mm because an electrical discharge pressure of about $10^{-2}$ Pa is selected for ordinary sputtering and the distance over which molecules of the target can travel to reach the substrate without colliding with molecules of the discharge gas is between 30 and 60 mm.

In the process of manufacturing a semiconductor and other electronic devices, as shown in FIG. 2A, there is a step of filling fine recesses on the substrate S by sputtering. These recesses are becoming finer and finer in recent years as a result of rigorous technological requirements imposed on the devices and can no longer be filled completely by the ordinary sputtering (see FIG. 2C) because many atoms strike the substrate obliquely by sputtering and hence the film is formed only at and near the apertures of recesses (see FIG. 2B)

This problem can be avoided by selecting a larger value fir the T/S distance that may typically be greater than 100 mm so that sputtered atoms may strike the substrate substantially perpendicularly relative to the letter. However, with such a long T/S distance and under the prevalent discharge pressure of about $10^{-1}$ Pa, sputtered atoms can collide with molecules of the discharge gas on the way to the substrate and not reach the substrate or strike the substrate obliquely. Therefore, the discharge pressure has to be raised to a level of about $10^{-2}$ Pa.

FIGS. 3A and 3B of the accompanying drawings schematically illustrate an example of a magnet that can be used for the magnetron sputtering. The magnet is arranged on the rear side of the target as shown in FIG. 1. FIG. 5 is a graph showing the result of measurement of the intensity of the magnetic field on the surface of a target where a sensor was moved from the center of the magnet to the outer periphery to measure the component running radially in parallel with the surface of the target (B (horizontal)) and the component directed perpendicularly relative to the surface of the target (b(vertical)). Electric discharge did not occur with this magnet until the vacuum level was higher than $3\times10^{-2}$ Pa.

FIGS. 4A and 4B schematically illustrate another magnet that can be used for the magnetron sputtering. FIG. 6 is a graph showing the result of measurement of the intensity of the magnetic field on the surface of the target. Again, electric discharge did not take place with this magnet until the vacuum was higher than $3\times10^{-2}$ Pa.

As described above, while magnetron discharge occurs by arranging a magnet on the rear side of the target, electric discharge does not necessarily occur if the pressure is held at a low level of about $10^{-2}$ Pa.

Further, there is a known proposal for driving a magnet eccentrically around a point displaced from the center of the target in an attempt to cause the entire surface of the target to sputter particles. However, with such a conventional arrangement, no electric discharge takes place under pressure of about $10^{-2}$ Pa if a large eccentricity is selected to activate the outer peripheral area of the target.

It is, therefore, an object of the present invention to provide a magnetron sputtering apparatus using a magnet that can produce an intensity of magnetic field that can ignite electric discharge at a pressure level of as low as $10^{-2}$ Pa.

SUMMARY OF THE INVENTION

According to one aspect of the present invention, there is provided a magnetron sputtering apparatus comprising a target for sputtering therefrom and a magnet arranged on the back side of the target for generating a closed loop magnetic field in front of the target, wherein the magnet is so arranged as to produce a magnetic field distribution on the surface of the target having a horizontal magnetic field intensity equal to 0 only at points located within the outer periphery of the target and to ignite electric discharge at a pressure level as low as $10^{-2}$ Pa.

Preferably, the magnet may be arranged to rotate eccentrically around a point displaced from the center of the target and the eccentricity of the magnet may be so selected as to produce a magnetic field distribution on the surface of the target showing a horizontal magnetic field intensity equal to 0 only at points located within the outer periphery of the target.

According to another aspect of the present invention, there is provided a magnetron sputtering apparatus comprising a target for sputtering therefrom and a magnet arranged on the back side of the target for generating a closed loop magnetic field in front of the target, wherein said magnet is so configured as to produce a magnetic field distribution having a horizontal magnetic field intensity of not lower than 140 Gauss at a position on the surface of the target where the horizontal magnetic field intensity is equal to 0 and to ignite electric discharge at a pressure level as low as $10^{-2}$ Pa.

As described above, with a magnetron sputtering apparatus according to another aspect of the present invention, with a magnetic field distribution having a horizontal magnetic field intensity of not lowes than 140 Gauss at a position on the surface of the target where the vertical magnetic field intensity is equal to 0 and a vertical magnetic field intensity of not lower than 60 Gauss at a position on the surface of the target where the horizontal magnetic field intensity is equal to 0 is produced, electric discharge can be ignited at a pressure level as low as $10^{-2}$ Pa.

BRIEF DESCRIPTIONS OF THE DRAWINGS

FIG. 1 is a schematic sectional view showing a conventional magnetron sputtering apparatus;

FIGS. 2A, 2B, and 2C are enlarged partial cross sectional views of a recess formed in a substrate arranged in the conventional magnetron sputtering apparatus, showing how film is formed therein in two different stages;

FIG. 5 is a graph showing the distribution of the magnetic field generated on the surface of a target by the magnet as shown in FIGS. 3A and 3B;

DETAILED DESCRIPTION OF THE PREFERRED EMBODIMENT

Now, the present invention will be described by referring to FIGS. 7 through 12, illustrating a preferred embodiment of the invention.

Figure 7:
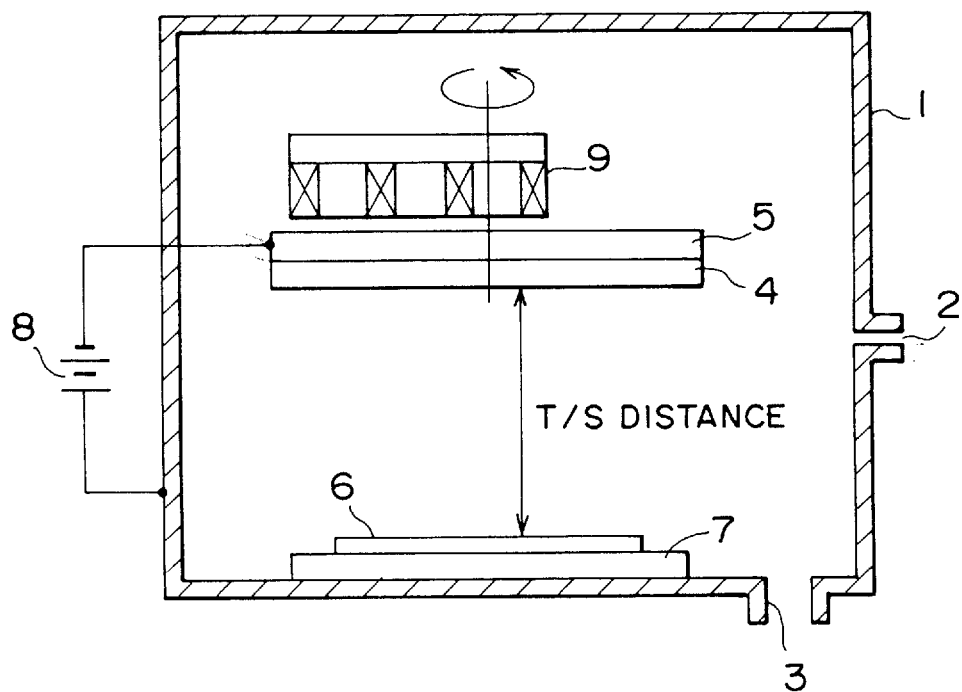
FIG. 7 is a schematic sectional view showing an embodiment of a magnetron sputtering apparatus according to the present invention.
Figure 8:
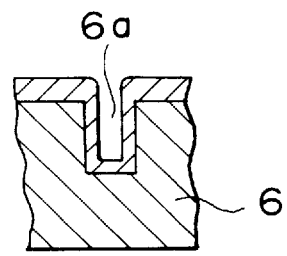
FIG. 8 is an enlarged partial cross sectional view of a recess formed in a substrate arranged in the embodiment of FIG. 7, showing how film is formed there.

FIG. 7 illustrates an embodiment of the magnetron sputtering apparatus according to the present invention.

Referring to FIG. 7, the illustrated sputtering apparatus comprises a vacuum vessel or chamber 1 provided with an inlet port 2 for introducing electric discharge gas such as argon gas and a gas outlet port 3 for evacuating part of the gas in the inside in order to maintain the internal pressure of the vacuum chamber 1 at a constant vacuum level. The vacuum chamber 1 contains therein a target 4 of the material for producing a film mounted on a target electrode 5 and a substrate 6 arranged opposite the target 4 and mounted on a substrate holder 7. The target electrode 5 is connected to the negative pole of a DC source 8.

A magnet 9 is arranged on the rear side of the target electrode 5 eccentrically relative to the center of the target 4 as seen from FIG. 7. The magnet 9 can be driven to rotate around the center of the target by a rotary drive mechanism (now shown). The intensity of the horizontal magnetic field produced on the surface of the target 4 by the magnet 9 is not less than 140 Gauss at 0 intensity of the vertical magnetic field and the vertical magnetic field intensity produced there is not less than 60 Gauss at 0 intensity of the horizontal magnetic field. A value greater than 100 mm is selected for the T/S distance, which is considerably greater than its counterpart of an arrangement for ordinary sputtering. The substrate 6 to be treated is provided on the surface disposed opposite to the target 4 with recesses 6a having a diameter of about 1 μm and a depth between about 1 and 2 μm (a large aspect ratio).

The above described and illustrated magnetron sputtering apparatus according to the invention operates in a manner as described below.

Referring to FIG. 7, the vacuum chamber 1 is evacuated by way of the gas outlet port 3 and argon gas or some other gas is introduced into the chamber 1 by way of the electric discharge gas inlet port 2 for producing electric discharge while maintaining the internal pressure of the vessel to about $10^{-2}$ Pa. As a voltage of 400 to 500V is applied to the target electrode 5 by means of the DC source 8 while rotating the magnet 9, electric discharge starts on the front surface of the target 4 to give rise to a sputtering phenomenon on the surface of the target 4. The sputtered atoms travel in diverse directions and, as a large value is selected for the T/S distance, only those atoms that leave the surface of the target 4 substantially perpendicularly can reach the substrate 6. While the T/S distance is large as described above, sputtered atoms can reach the substrate without colliding with gas molecules on the path because the gas pressure within the vacuum chamber 1 is as low as $10^{-2}$ Pa. Consequently, most of the atoms that reach the substrate strike the latter substantially perpendicularly relative to the surface thereof so that a film is formed on the bottom of each and every recess 6a on the surface of the substrate 6 as typically shown in FIG. 8.

Figure 9:
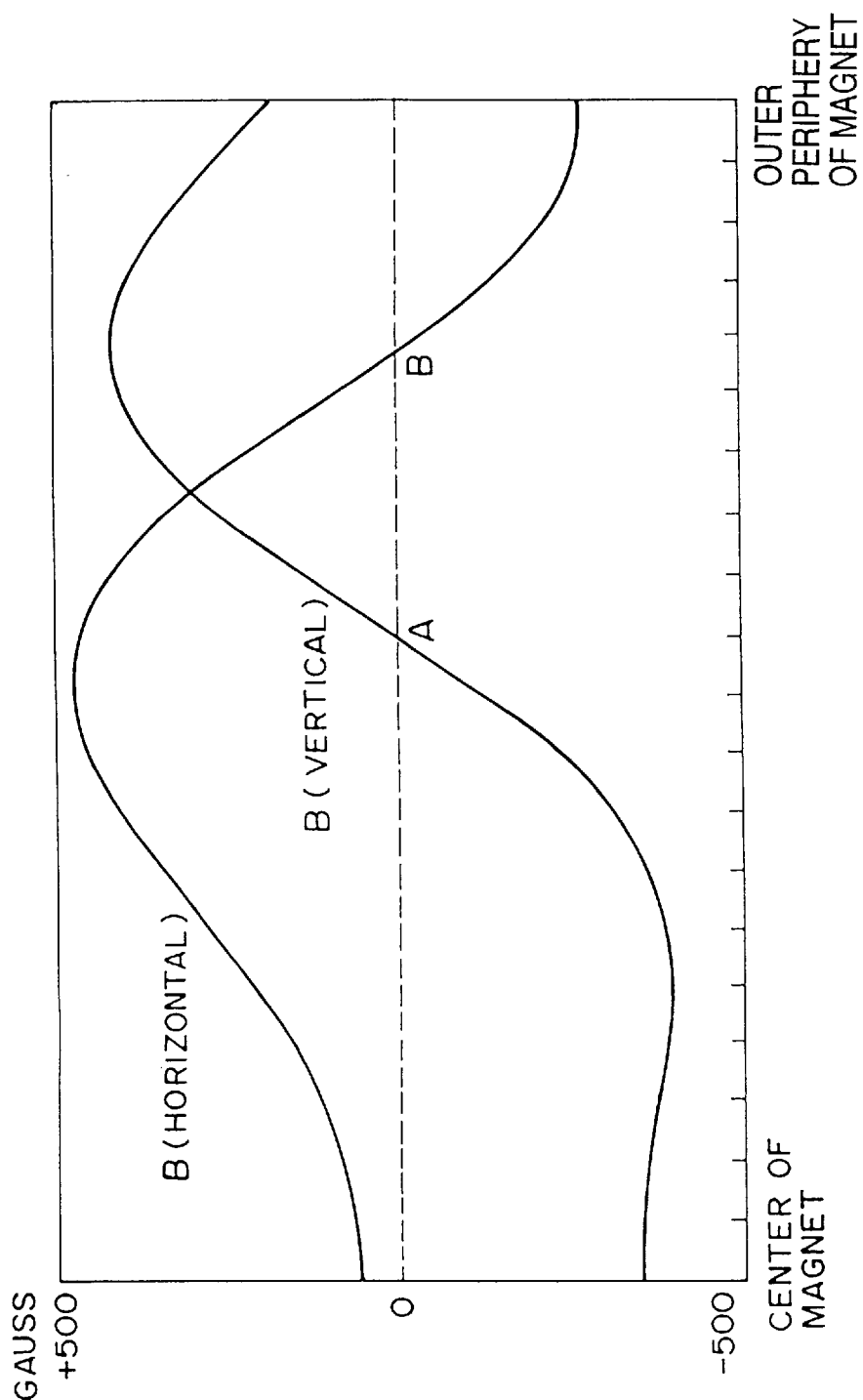
FIG. 9 is a graph showing the distribution of magnetic field generated on the surface of the target by the magnet that can be used for the purpose of the invention.

In an experiment, the magnetic field intensity was observed on the surface of the target 4. A result is shown in FIG. 9. FIG. 9 shows the result obtained for the magnetic field intensity on the surface of the target in terms of the radial component (B(horizontal)) and the vertical component (B(vertical)) relative to the surface of the target when the sensor was moved from the center of the magnet 9 toward the outer periphery thereof.

Figure 10:
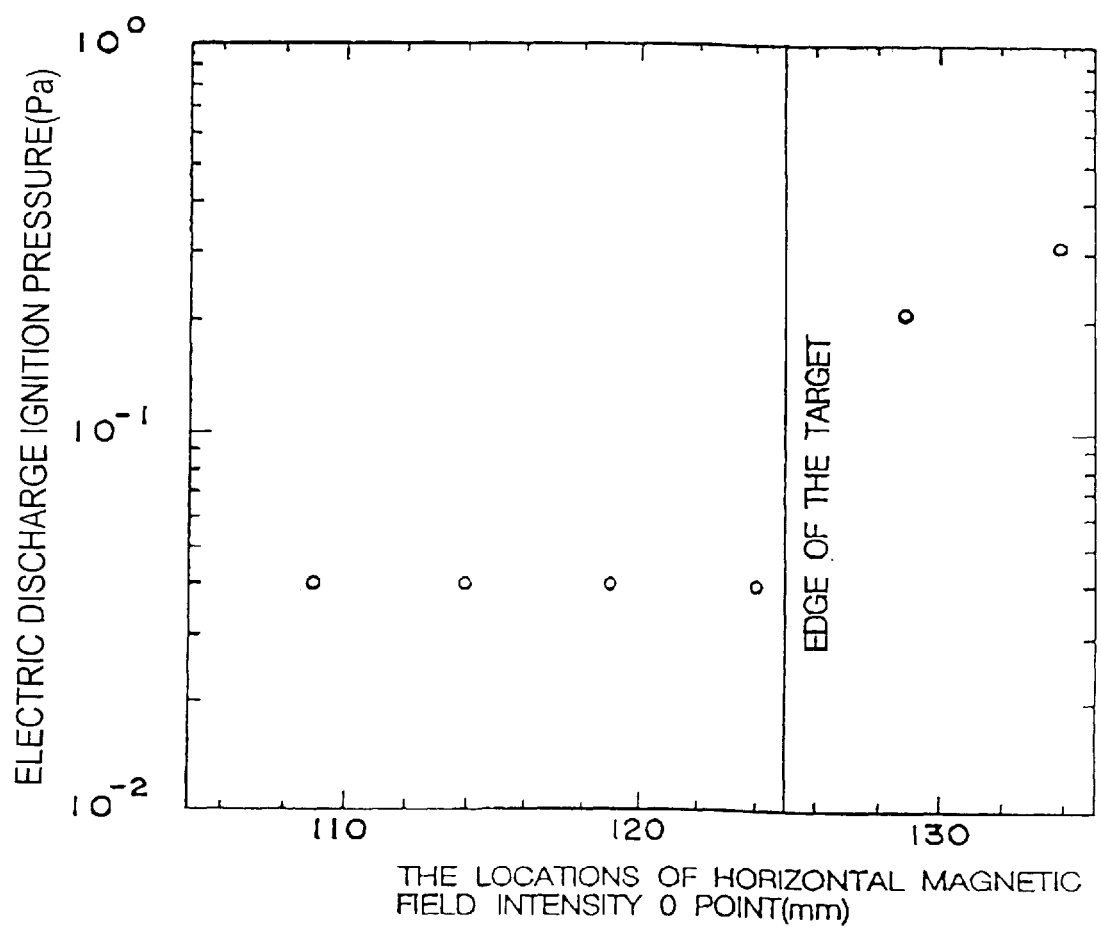
FIG. 10 is a graph showing the relationship between the electric discharge ignition pressure and the locations of horizontal magnetic field intensity 0 points in the magnetron sputtering apparatus according to the present invention.

FIG. 10 shows another result obtained when the electric discharge ignition pressure was observed, while moving the magnet 9 eccentrically from the center of the target 4. In FIG. 10, the abscissa represents the distance of position B(horizontal)-0 (points B in FIG. 9) from the center of the target, which is proportional to the eccentricity. A value of 125 mm represents the point remotest from the center of the target 4. As seen, electric discharge is not ignited unless position B(horizontal)-0 is located within the outer periphery of the target 4.

Thus, point B(horizontal)-0 produced by the magnet 9 is located within the outer periphery of the target 4 so that electric discharge may be ignited at a pressure level as low as about $10^{-2}$ Pa.

Figure 11:
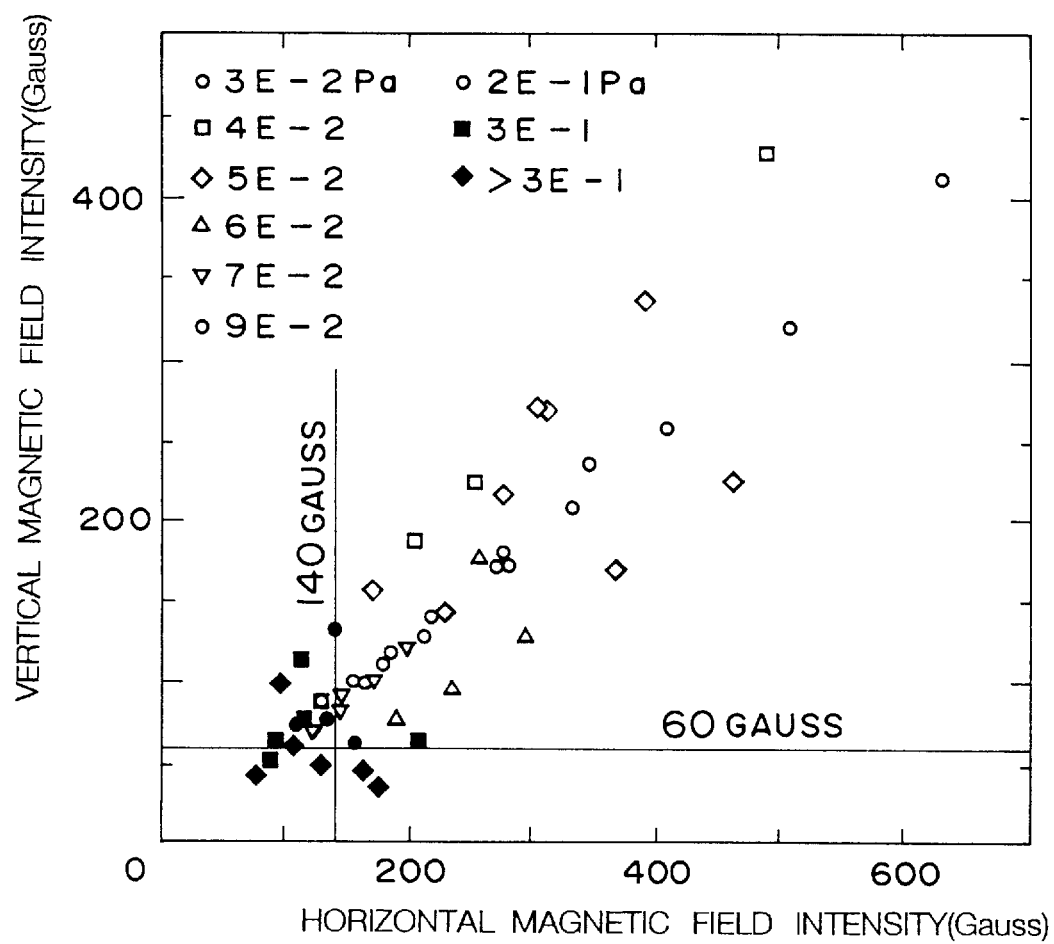
FIG. 11 is a graph showing the magnetic field intensity of the magnet that can be used for the purpose of the invention.

In an experiment, changes in the pressure for igniting electric discharge with different magnetic field intensities and different magnetic field distributions were observed. FIG. 11 shows the result. In the graph of FIG. 11, the abscissa represents the horizontal magnetic field intensity at a position where the vertical magnetic field intensity is equal to 0 (point A in FIG. 12) and the ordinate represents the vertical magnetic field intensity at a position where the horizontal magnetic field intensity is equal to 0 (point B in FIG. 12). In FIG. 11, each of the black spots shows that electric discharge ignited under a pressure not lower than $10^{-2}$ Pa and the conditions defined by the spot, whereas each of the white spots shows that electric discharge ignited under a pressure not lower than $10^{-2}$ Pa and defined by the spot.

Figure 1:
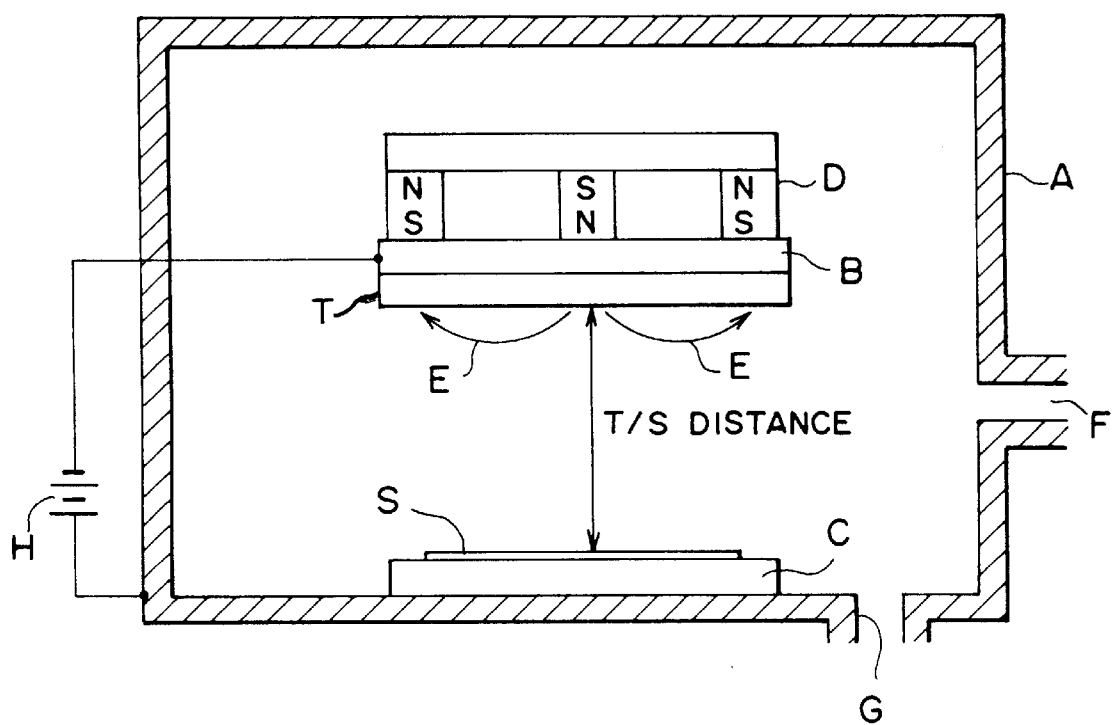
Figure 2A:
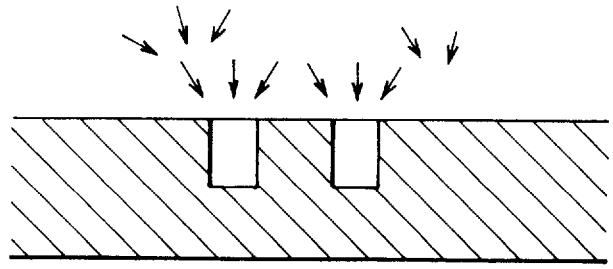
Figure 2B:
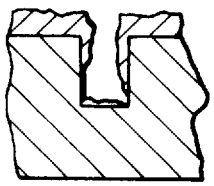
Figure 2C:
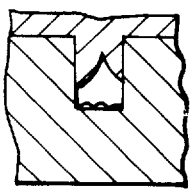
Figure 3A:
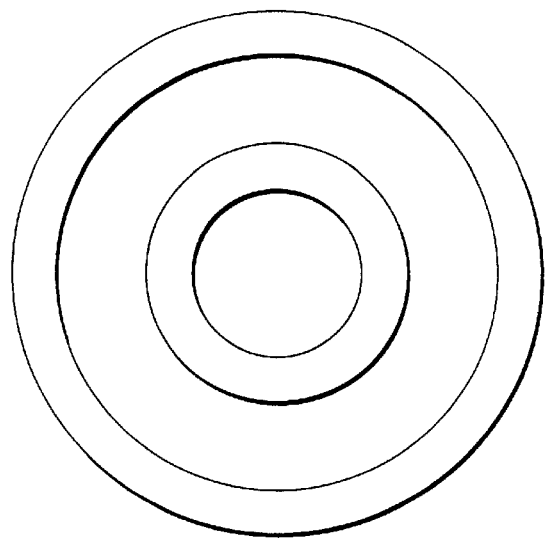
FIGS. 3A and 3B are schematic view of a magnet that can be used for the conventional magnetron sputtering apparatus.
Figure 3B:
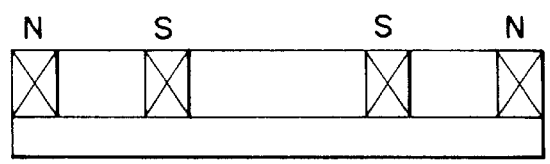
Figure 4A:
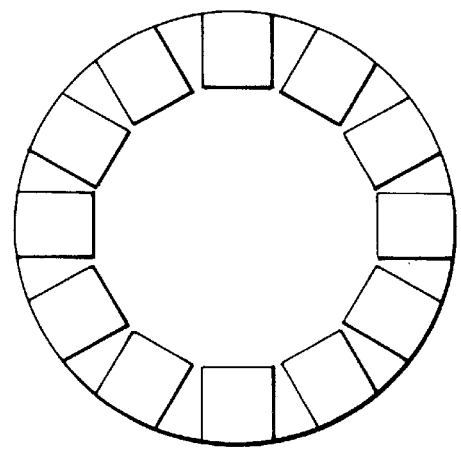
FIGS. 4A and 4B are schematic views of another magnet that can be used for the conventional magnetron sputtering apparatus.
Figure 4B:
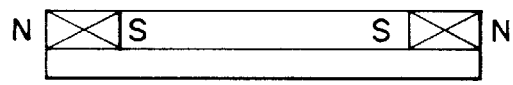
Figure 6:
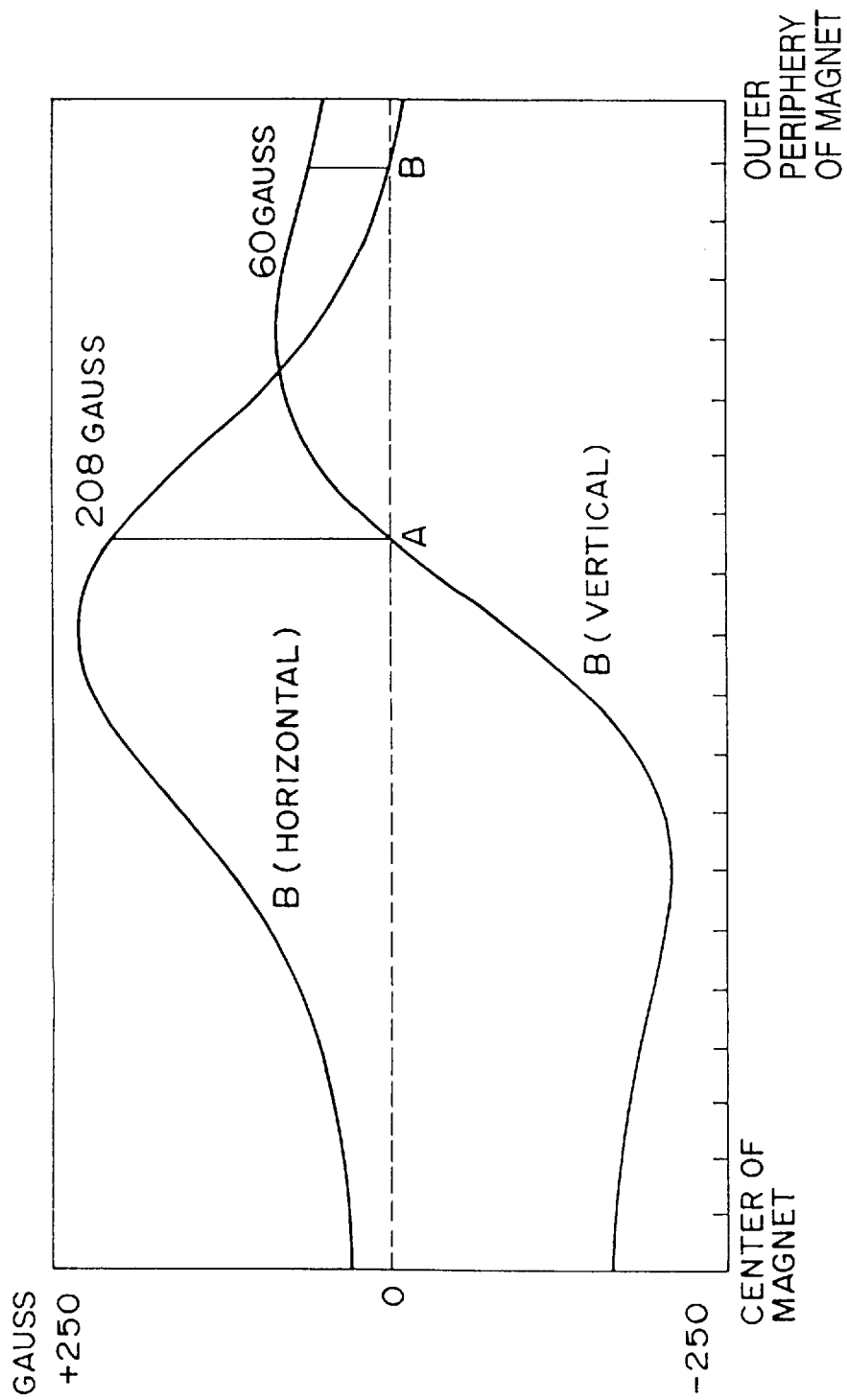
FIG. 6 is a graph showing the distribution of magnetic field generated on the surface of a target by the magnet as shown in FIGS. 4A and 4B.
Figure 12:
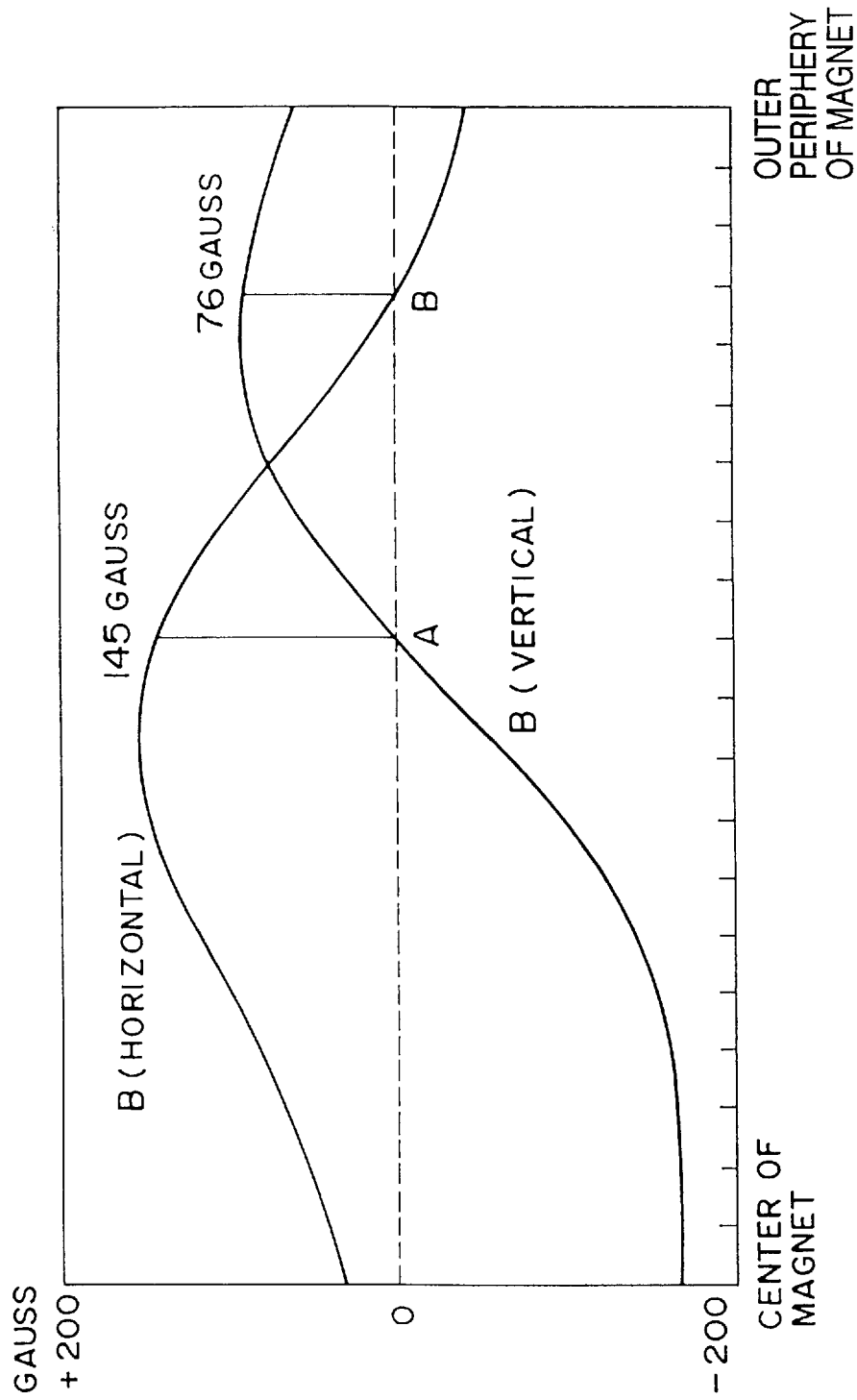
FIG. 12 is a graph showing the distribution of magnetic field generated on the surface of the target by the magnet that can be used for the purpose of the invention.

From the result of the experiment, it is clear that, for electric discharge to ignite, both the requirements of a horizontal magnetic field intensity not less than 140 Gauss at 0 intensity of the vertical magnetic field and a vertical magnetic field intensity not less than 60 Gauss at 0 intensity of the horizontal magnetic field have to be met. Thus, a magnet having a magnetic field have to be met. Thus, a magnet having a magnetic field distribution of horizontal magnetic field intensity of not less than 140 Gauss at 0 intensity of the vertical magnetic field and vertical magnetic field intensity of not less than 60 at 0 intensity of horizontal magnetic field has to be used for the purpose of the invention. The above requirements may be satisfied by providing a magnet which has a configuration as shown in FIGS. 3A and 3B and produces a magnetic field distribution on the surface of a target as shown in FIG. 12.

While in the magnet used for the above embodiment the N pole is formed along the outer periphery and the S pole is arranged in the inside of the magnet as shown in each of FIGS. 3A and 3B or 4A and 4B, the N and S poles may be positionally switched relative to each other without affecting the operation of the apparatus because only the absolute value of the magnetic field intensity on the surface of the target is important for the purpose of the present invention.

As described above in detail, in the magnetron sputtering apparatus according to one aspect of the present invention, the magnet is so chosen as to produce a magnetic field distribution on the surface of the target having a horizontal magnetic field intensity equal to 0 only at points located within the outer periphery of the target and to ignite electric discharge at a pressure level as low as $10^{-2}$ Pa.

According to another aspect of the invention, the magnetron sputtering apparatus comprises a magnet that produces a magnetic field distribution having a horizontal magnetic field intensity of not lower than 140 Gauss at a position on the surface of the target where the vertical magnetic field intensity is equal to 0 and a vertical magnetic field intensity of not mower than 60 Gauss at a position on the surface of the target where the horizontal magnetic field intensity is equal to 0 is produced so that electric discharge is ignited at a pressure level as low as $100^{-2}$ Pa. Therefore, sputtered atoms do not collide with discharge gas molecules on the path to the substrate if a value greater than 100 mm is selected for the T/S distance so that only a few sputtered atoms strike the substrate obliquely and a thin film is formed on the bottom of each and every recess of the surface of the substrate.

I claim:

1. A magnetron sputtering apparatus, comprising:

a vacuum chamber, a sputtering target located in said vacuum chamber, said target having a back side and a front surface, a magnet arranged in said vacuum chamber on the back side of the target for generating a closed loop magnetic field in front of the target and for producing a magnetic field distribution having a horizontal magnetic field intensity of not lower than 140 Gauss at a position on the surface of the target where a vertical magnetic field intensity is equal to 0 and a vertical field intensity of not lower than 60 Gauss at a position on the surface of the target where the horizontal magnetic field intensity is equal to 0 so as to ignite electric discharge at a pressure level as low as $10^{-2}$ Pa.

2. A magnetron sputtering apparatus as claimed in claim 1, wherein the target has an outer periphery, and the magnet produces a magnetic field distribution on the surface of the target wherein the horizontal magnetic field intensity is equal to 0 only at points located within the outer periphery of the target to thus ignite electric discharge at a pressure level as low as $10^{-2}$ Pa.

3. A magnetron sputtering apparatus as claimed in claim 1, wherein the target has a center and wherein the magnet is arranged eccentrically relative to the center of the target and is rotatable around a central axis of the target so to produce a magnetic field distribution on the surface of the target wherein the horizontal magnetic field intensity is equal to 0 only at points located within an outer periphery of the target.

* * * * *